United States Patent [19]

Ley

[11] Patent Number: 5,500,555
[45] Date of Patent: Mar. 19, 1996

[54] MULTI-LAYER SEMICONDUCTOR PACKAGE SUBSTRATE WITH THERMALLY-CONDUCTIVE PREPEG LAYER

[75] Inventor: Tom Ley, Santa Clara, Calif.

[73] Assignee: LSI Logic Corporation, Milpitas, Calif.

[21] Appl. No.: 225,860

[22] Filed: Apr. 11, 1994

[51] Int. Cl.[6] .................... H01L 23/053; H01L 23/12; H01L 23/14
[52] U.S. Cl. .................... 257/700; 257/702; 257/789
[58] Field of Search .................... 257/700, 701, 257/702, 789

[56] References Cited

U.S. PATENT DOCUMENTS

| | | | |
|---|---|---|---|
| 4,972,253 | 11/1990 | Palino et al. | 357/74 |
| 5,043,794 | 8/1991 | Tai et al. | 257/722 |
| 5,179,777 | 1/1993 | Suzuki | 29/848 |
| 5,196,725 | 3/1993 | Mita et al. | 257/691 |
| 5,291,062 | 3/1994 | Higgins, III | 257/693 |

*Primary Examiner*—Rolf Hille
*Assistant Examiner*—David Ostrowski
*Attorney, Agent, or Firm*—Katz & Cotton

[57] ABSTRACT

Improved thermal characteristics are obtained in a multi-layer substrate for mounting a semiconductor device. A prepeg layer disposed in close proximity to or immediately adjacent to a semiconductor device is formed incorporating an integral, thermally-conductive mesh or screen. The prepeg layer is preferably a sandwich structure of two BT-resin layers (films), between which is disposed a copper screen. In this manner, heat is conducted away from an operating device by an integral part of the substrate, without the need for additional slugs or heat sink structures. Utility for multichip modules is also disclosed.

5 Claims, 3 Drawing Sheets

5,500,555

MULTI-LAYER SEMICONDUCTOR PACKAGE SUBSTRATE WITH THERMALLY-CONDUCTIVE PREPEG LAYER

TECHNICAL FIELD OF THE INVENTION

The invention relates to the construction of multi-layer substrates for mounting and packaging individual semiconductor devices (chips), integrated circuits (ICs), and multi-chip modules.

BACKGROUND OF THE INVENTION

Present multi-layer semiconductor packaging techniques include multi-layer ceramic packages and multi-layer fiber-based packages. An example of a multi-layer ceramic package is shown in U.S. Pat. No. 4,972,253. Generally, in these multi-layer packages, several layers of non-conductive material (ceramic, fiber, resin, etc.) are laid up (laminated) with interleaved conductive wiring layers and power/ground planes, forming a mounting substrate and package for a semiconductor device (chip). The chip is mounted in an opening extending partially into the package (substrate) from an external surface thereof. These packages are sometimes referred to as "chip carriers".

In the case of multi-chip modules, two or more bare (unpackaged) chips may be mounted to a printed circuit board (PCB) substrate, typically to a multi-layer PCB having several levels of interconnects, and are eventually encapsulated or covered in some suitable manner.

The present invention relates primarily to chip carriers and multi-chip module substrates using several layers of printed circuit board material, namely "FR4" and "prepeg". "FR4" is a fibrous board material. "Prepeg" is essentially a flexible sheet of B-stage resin, or the like. One known prepeg material is BT resin.

Heat is inevitably generated during operation of a semiconductor device, and may become destructive of the device if left unabated. Modern semiconductor devices, operating at high speeds and with densely packed (i.e., small) transistor structures (e.g.) are particularly prone to heat-induced problems, such as outright device failure. Hence, one problem that must be addressed in virtually all modern semiconductor packaging schemes is providing a mechanism for conducting heat away from the operating semiconductor device. Previous techniques include the assembly of various discrete heat sink structures, slugs atop which the chip is mounted, thermally conductive vias extending through the package or substrate towards the reverse (non-circuit) side of the chip, and the like. The general overall object is to incorporate a thermally-conductive element close to the heat-generating die. However, the aforementioned approaches involve extra components and extra manufacturing steps, both of which add undesirable cost to the finished (i.e., packaged) device.

FIG. 1 shows a prior art technique 100 for packaging a semiconductor device. A multi-layer substrate 102 is fabricated of several (three shown) "core" layers 104, 106 and 108 of printed circuit board material, such as "FR4". These core layers typically contain a mat (or weave) of glass fiber, and a resin matrix. Interleaved between these core layers are layers of "prepeg" —a layer of prepeg 110 is disposed between the core layers 104 and 106, and a layer of prepeg 112 is disposed between the core layers 106 and 108. The layers 104, 106, 108, 110 and 112 are all of essentially the same overall dimension.

As shown in the example of FIG. 1:

The first, bottom-most (i.e., towards the legend "REAR") layer is a core layer 104 of generally planar (sheet-like) structure having a number of vias 112 extending completely therethrough in a central region thereof.

The next higher (towards the legend "FRONT") layer is a planar prepeg layer 110, with no openings.

The next higher layer is a core layer 106, which is also a planar structure, but which has a central opening 114 therethrough of sufficient dimension to accommodate a semiconductor device (DIE) 120 disposed in the opening 114, co-planar with the layer 106. The opening is about 0.050 to 0.100 inches larger than the die 120. In this manner, inner ends of wiring traces formed of a copper cladding (not shown) atop (towards "FRONT" legend) the prepeg layer 110 are exposed in the opening 114 for connection (e.g., wire bonding) to the semiconductor device 120.

The next higher layer is another layer of prepeg 112 having a central opening 116 therethrough of dimension slightly (about 0.050 to 0.100 inches) larger than the opening 114 in the next lower layer 106. In this manner, inner ends of wiring traces formed of a copper cladding (not shown) atop (towards "FRONT" legend) the core layer 106 are exposed in the opening 116 for connection (e.g., wire bonding) to the semiconductor device 120. (Having two levels of wiring traces is not uncommon.)

The next higher, top-most layer is another core layer 108 having a central opening 118 therethrough of dimension substantially (e.g., 0.100 to 0.200 inches) larger than either of the previous openings 114 and 116. In this manner, a shelf is formed on the front surface of the inner edge of the next lower prepeg layer 112, upon which a lid 130 is ultimately disposed to seal the die 120 within the package body formed by the substrate 102.

As shown in FIG. 1, an array of pins 140 extend normally (i.e., at ninety degrees) from the front surface of the top layer 108. As is known, these pins extend through various layers and make connection to the wiring traces and/or power and ground planes within the laminated substrate.

As is known, a plurality of bond wires 122 are connected between pads 124 on the front (active element) surface of the die 120 to the inner ends of wiring traces on the various levels of the substrate.

In use, the entire packaged semiconductor device is inserted by its pins 140 into a socket, or into aligned holes on a printed wiring board.

DISCLOSURE OF THE INVENTION

It is therefore an object of the present invention to provide a technique for incorporating a thermally-conductive element integrally in a semiconductor package, while avoiding additional manufacturing steps and additional expense.

It is a further object to provide an improved semiconductor device package, having enhanced thermal characteristics.

It is a further object to provide an improved substrate for multi-chip modules, having enhanced thermal characteristics.

According to the invention, in a multi-layer substrate for mounting/packaging semiconductors, a layer of prepeg immediately adjacent to the semiconductor die is formed as a sandwich structure of two prepeg layers with an integral copper screen layer interposed between the two prepeg layers.

In this manner, heat generated by the operating semiconductor device is conducted away from the device. In essence, the copper screen layer acts as an integral heat spreader within the multi-layer substrate.

Other objects, features and advantages of the invention will become apparent in light of the following description thereof.

DETAILED DESCRIPTION OF THE INVENTION

Figure 1:
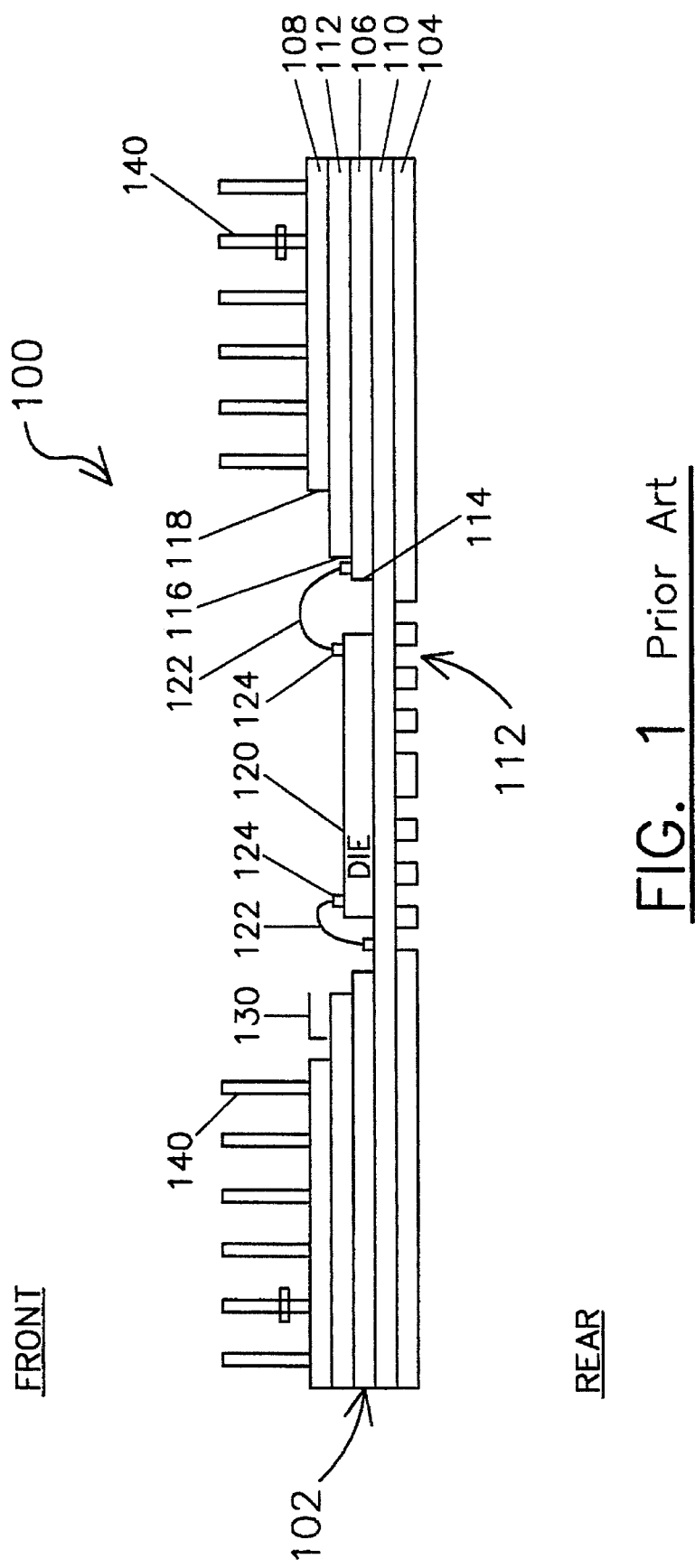
FIG. 1 is a cross-sectional view of a prior art, multi-layer chip carrier using printed circuit board materials.

FIGS. 1 shows a prior art, multi-layer chip carrier using printed circuit board materials, and has been discussed hereinabove.

In the manufacture of such a packaged semiconductor device, the package (i.e., substrate 102) is manufactured separately from the device (i.e., die 120).

Regarding manufacture of the package, the core layers (e.g., 104, 106 and 108 of FIG. 1) are usually relatively stiff sheets of "FR4" circuit board material, which may be copper clad on one or both sides. A wiring trace pattern is specified, and the copper cladding is appropriately patterned (e.g., etched). An appropriate thickness for a core layer is 0.080–0.012 inches.

Figure 2:
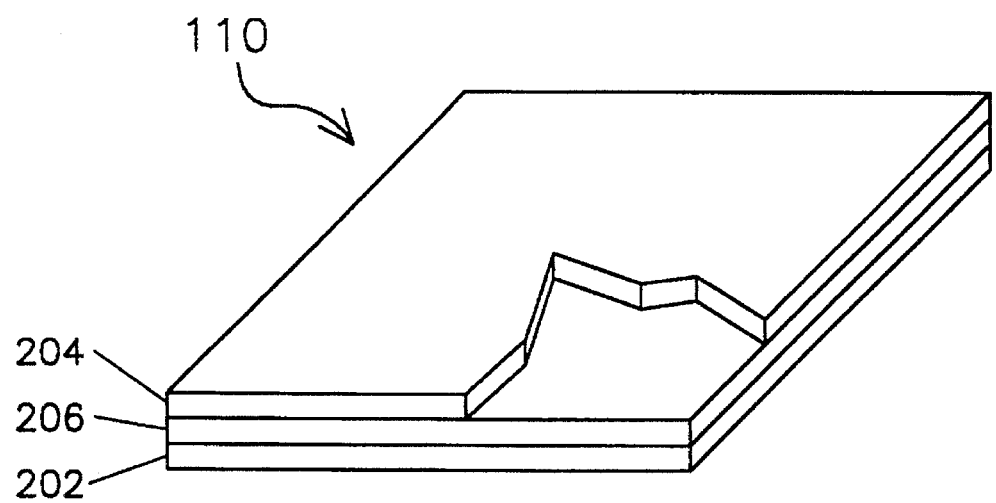
FIG. 2 is a perspective, partially broken away view of a prior art prepeg layer incorporating a glass fiber mat.

On the other hand, the prepeg layers are commonly formed of a relatively flexible sheet of BT-resin (a B-stage resin type material). More particularly, as shown in FIG. 2, the prepeg layer immediately adjacent and underneath the die (e.g., the prepeg layer 110 of FIG. 1) is formed as a sandwich structure of two prepeg layers (films) 202 and 204, between which is disposed a layer of glass fiber material 206. In this example, the glass fiber layer is shown as a mat of randomly-oriented glass fibers.

A typical thickness for the BT-resin films 202 and 204 is 0.008–0.010 inches, and for the glass fiber layer 206 is 0.008 inches.

The prior art BT-resin and glass fibers layers are very poor conductors of heat. Yet, the applicant for the present invention has realized that the prepeg layer 110 is disposed in a virtually ideal location for transferring heat away from the operating semiconductor device, i.e., acting as a heat spreader. The typical solution to thermal transfer problems is the addition of a discrete heat sink structure, as discussed hereinabove.

According to the invention, in a multi-layer semiconductor package, a prepeg layer disposed in close proximity to, or immediately adjacent to, a semiconductor device is formed incorporating an integral, thermally-conductive mesh or screen.

Figure 3:
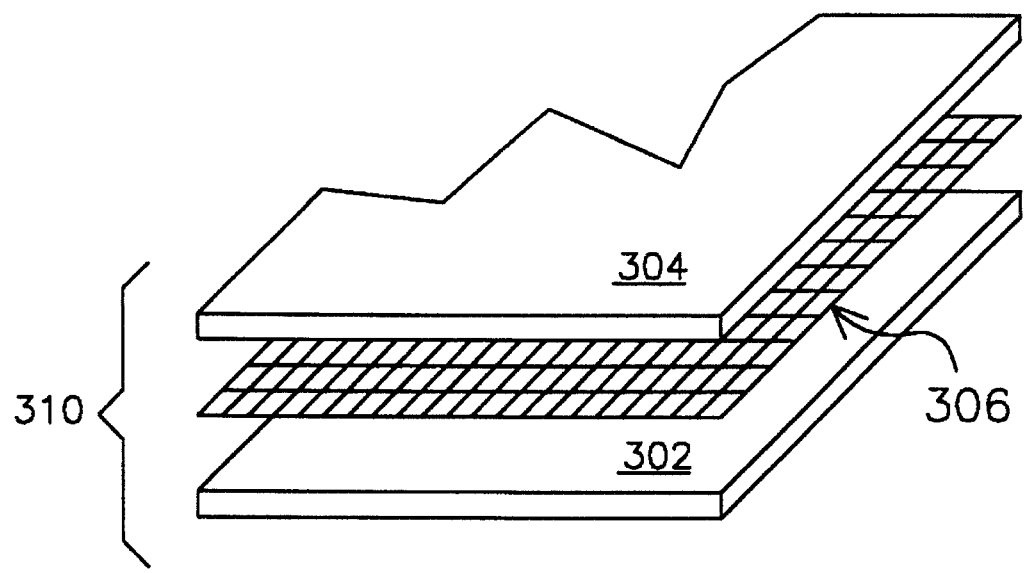
FIG. 3 is an exploded perspective view of a prepeg layer, according to the present invention, for use in a multi-layer substrate for packaging semiconductor devices or for mounting a plurality of devices in a multi-chip module (MCM).

FIG. 3 shows a prepeg layer 310, suitably employed as the prepeg layer 110 of the substrate 102 (FIG. 1). Returning to FIG. 1, we see that the prepeg layer 110 is ideally situated to perform a heat transfer function, in that the die 120 is mounted directly to this layer (or indirectly via an intervening layer of copper cladding atop the prepeg layer 110, as the case may be).

The prepeg layer 310 is formed as a sandwich structure of two layers (films) 302 and 304 of BT-resin, between which is interposed a layer of copper screen 306. A suitable thickness for the BT-resin films 302 and 304 is 0.008–0.010 inches.

The copper screen 306 is formed of any suitable weave, such as a square weave, of 0.0015 inch wire, tightly woven.

Functionally, the use of a copper screen 306 in the prepeg layer immediately adjacent the die avoids the use of a separate copper slug, or thermal vias in the substrate, although the latter (i.e., thermal vias) can also be included as additional means for transferring heat away from the operating semiconductor device.

The screen 306 is preferably formed of copper, which has excellent heat conduction and dissipation characteristics. However, other heat-conductive materials such as alloys of copper can be used. Preferably, the thermal expansion characteristics (e.g., coefficient) of the screen should match that of the remaining printed circuit board materials. A Copper-Tungsten alloy, for example, has thermal expansion characteristics matching well those of the semiconductor die itself, but is a poorer conductor of heat than copper. In the disclosed packaging scheme, since the die is not resting directly on the screen (306), but rather there is an intervening layer of BT resin (304), the difference in thermal expansion characteristics between a copper screen and the die is of little significance.

Figure 4:
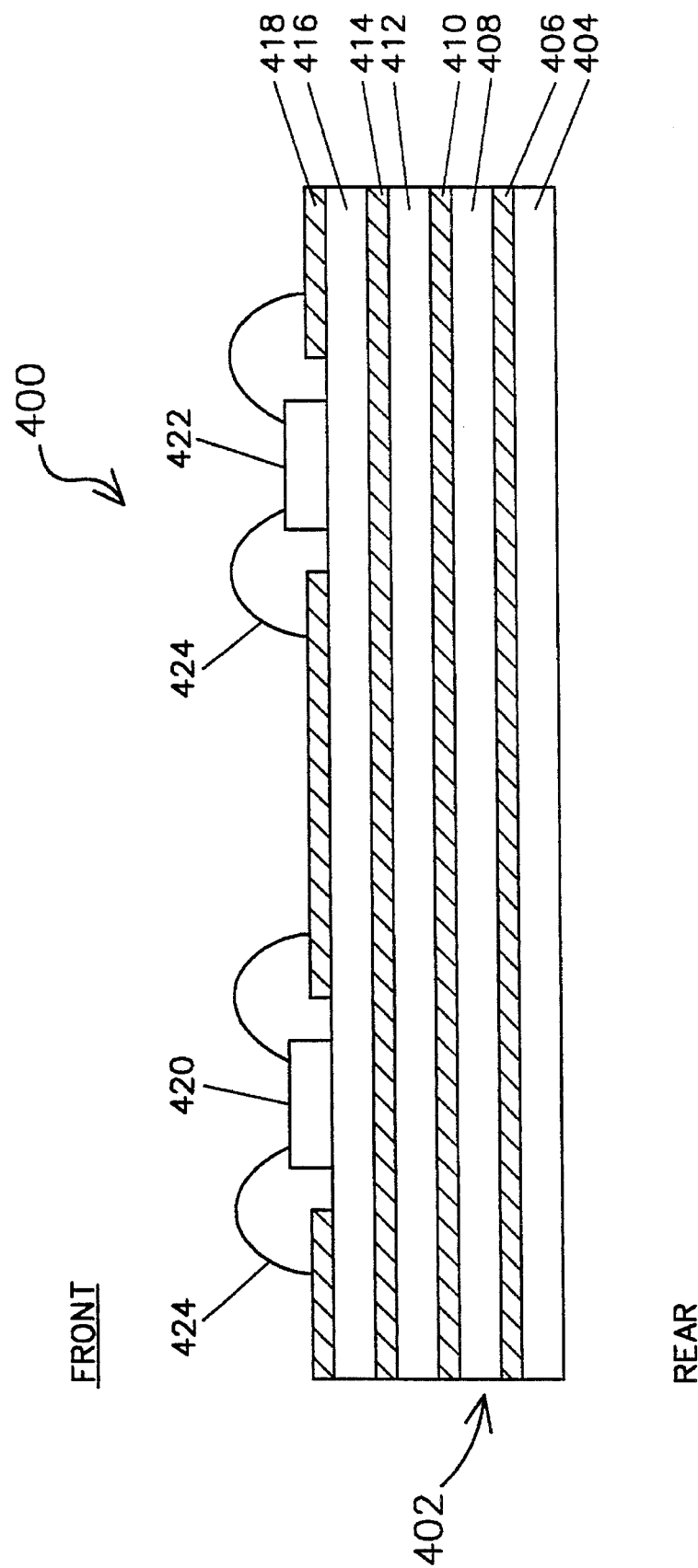
FIG. 4 is a cross-sectional view of a multi-chip module incorporating the prepeg layer of FIG. 3.

FIG. 4 shows a multi-chip module 400 incorporating a multi-layer substrate 402 formed according to the present invention. The substrate 402 comprises, from "REAR" to "FRONT" (as shown), a bottom core (FR4) layer 404 having a copper cladding 406 on its front surface, followed by a prepeg layer 408, followed by another core layer 412 having copper cladding 410 on its rear surface and copper cladding 414 on its front surface, followed by a prepeg layer 416 having copper cladding on 418 on its front surface. In this example, the exposed cladding 418 is patterned into wiring traces. The other claddings 414, 410 and 406 are patterned or non-patterned. Vias (not shown) extend through the various layers for interconnecting the various copper cladding layers.

A plurality of semiconductor dies 420 and 422 are mounted to the front surface of the substrate 402, and connected via bond wires 424 to the top wiring layer 418. Eventually, the dies 420 and 422 are covered with glob-top epoxy, or the like.

In a manner similar to that shown with respect to FIG. 3, and the variants thereof, the prepeg layer 416, which is the layer disposed most nearly to the dies, is formed as a sandwich structure of "prepeg" and copper mesh.

By constructing the substrate layer nearest to the semiconductor device(s) as a sandwich of prepeg and copper mesh, a large surface area, thermally-conductive element is formed integral with the substrate (FIG. 4) or semiconductor package body (using the prepeg layer 310 in the FIG. 1 package), and is effective in conducting heat away from operating die(s). This will improve device reliability and lower costs of mounting/packaging semiconductor dies.

Thermal vias extending through an adjacent (to the copper-screen-prepeg) layer (e.g., a core layer) can also be provided, in a manner illustrated by FIG. 1. Alternatively, at least one larger opening can be provided through the adjacent core (e.g.) layer can also be provided to receive a heat sink slug(s). Both of these features would further improve conduction of heat away from the operating device.

What is claimed is:

1. A semiconductor package body for receiving a semiconductor device, including a multi-layer substrate comprising:

a first, bottom-most planar core layer;

a second, next higher planar prepeg layer formed as a sandwich structure of two BT-resin films with a copper screen interleaved between the two BT-resin films;

a third next higher layer is a planar core layer having a first opening extending through a central region thereof, said first opening being of sufficient dimension to accommodate a semiconductor device disposed in the first opening, co-planar with the third layer and resting upon said second layer;

a fourth next higher layer is a planar prepeg layer having a second opening extending through a central region thereof, said second opening being larger than said first opening; and a fifth next higher, top-most layer is a planar core layer having a third opening extending therethrough, said third opening being larger than said second opening.

2. A semiconductor package body, according to claim 1, wherein:

at least one of the core layers has a number of vias extending completely therethrough in a central region thereof.

3. A semiconductor package body, according to claim 1, further comprising:

a layer of copper cladding patterned as wiring traces disposed atop the second layer such that inner ends of the wiring traces extend into the first opening, so that a semiconductor die disposed within the first opening can be connected to the inner ends of the first level wiring traces.

4. A semiconductor package body, according to claim 1, further comprising:

a layer of copper cladding patterned as wiring traces disposed atop the third layer such that inner ends of the wiring traces extend into the second opening, so that a semiconductor die disposed within the first opening can be connected to the inner ends of the first level wiring traces.

5. A semiconductor package body, according to claim 1, further comprising:

a shelf formed by an inner edge of the fourth layer, within the third opening; and a lid disposed within the third opening to seal a die within a package body formed by the substrate and the lid.

* * * * *